(12) United States Patent
Kedem

(10) Patent No.: US 12,068,223 B2
(45) Date of Patent: Aug. 20, 2024

(54) METHOD OF CONSTRUCTING A CIRCUITRY ASSEMBLY FOR HEAT DISPERSAL USING A PHASE CHANGE MATERIAL

(71) Applicant: Elta Systems Ltd., Ashdod (IL)

(72) Inventor: Michael Kedem, Ashdod (IL)

(73) Assignee: Elta Systems Ltd., Ashdod (IL)

( * ) Notice: Subject to any disclaimer, the term of this patent is extended or adjusted under 35 U.S.C. 154(b) by 497 days.

(21) Appl. No.: 17/360,049

(22) Filed: Jun. 28, 2021

(65) Prior Publication Data

US 2021/0327786 A1  Oct. 21, 2021

Related U.S. Application Data

(63) Continuation of application No. 16/922,268, filed on Jul. 7, 2020, now abandoned, which is a continuation of application No. 16/299,401, filed on Mar. 12, 2019, now Pat. No. 10,748,837.

(30) Foreign Application Priority Data

Mar. 29, 2018 (IL) .......................................... 258555

(51) Int. Cl.
  *H01L 23/427* (2006.01)
  *H05K 1/02* (2006.01)
  *H05K 3/00* (2006.01)
  *H05K 3/12* (2006.01)
  (Continued)

(52) U.S. Cl.
  CPC ......... *H01L 23/427* (2013.01); *H05K 1/0203* (2013.01); *H05K 1/0272* (2013.01); *H05K 3/0061* (2013.01); *H05K 3/12* (2013.01); *H05K 3/301* (2013.01); *H05K 7/20327* (2013.01);
  (Continued)

(58) Field of Classification Search
  CPC ..... H01L 23/36; H01L 23/427; H05K 1/0203; H05K 1/0272; H05K 3/0061; H05K 3/12; H05K 3/301; H05K 7/20327; H05K 2201/09036
  See application file for complete search history.

(56) References Cited

U.S. PATENT DOCUMENTS

| 3,780,356 A | 12/1973 | Laing |
| 6,827,136 B2 | 12/2004 | Liu |
| 6,848,500 B1 | 2/2005 | Langari et al. |

(Continued)

FOREIGN PATENT DOCUMENTS

| EP | 1162659 A2 * | 12/2001 | ............. F28D 15/02 |
| WO | 2004109798 A1 | 12/2004 | |

OTHER PUBLICATIONS

"European Search Report for EP 19165468, mailed Aug. 13, 2019".

*Primary Examiner* — Alonzo Chambliss
(74) *Attorney, Agent, or Firm* — Dorsey & Whitney LLP

(57) ABSTRACT

A heatsink assembly comprising a substrate having an active circuitry, at least one cavity located adjacent to at least one heat producing element of the active circuitry, at least one vessel sealably coupled to said substrate in fluid communication with the at least one cavity, and a phase change material (PCM) contained inside the vessel. The vessel and at least one cavity configured to facilitate migration of the PCM from the vessel into the at least one cavity for absorbing heat produced by the at least one heat producing element of the active circuitry.

17 Claims, 4 Drawing Sheets

(51) Int. Cl.
   *H05K 3/30*        (2006.01)
   *H05K 7/20*        (2006.01)
(52) U.S. Cl.
   CPC . *H05K 2201/09036* (2013.01); *Y10T 29/4913* (2015.01)

(56) References Cited

U.S. PATENT DOCUMENTS

| | | | |
|---|---|---|---|
| 7,183,133 B2* | 2/2007 | Lindgren | H01L 23/427 |
| | | | 257/E23.102 |
| 7,191,820 B2 | 3/2007 | Chou et al. | |
| 10,748,837 B2* | 8/2020 | Kedem | H05K 3/12 |
| 2002/0033247 A1 | 3/2002 | Neuschutz et al. | |
| 2004/0041255 A1 | 3/2004 | Lindgren et al. | |
| 2004/0195677 A1* | 10/2004 | Lindgren | H01L 23/367 |
| | | | 257/E23.102 |
| 2005/0280162 A1 | 12/2005 | Mok et al. | |
| 2007/0075407 A1* | 4/2007 | Lindgren | H01L 24/31 |
| | | | 257/E23.088 |
| 2011/0156245 A1 | 6/2011 | Wu et al. | |
| 2013/0003303 A1* | 1/2013 | Lindgren | H01L 23/367 |
| | | | 361/704 |
| 2014/0043754 A1 | 2/2014 | Hartmann et al. | |
| 2014/0268579 A1 | 9/2014 | Nguyen et al. | |
| 2016/0223269 A1 | 8/2016 | Hartmann et al. | |

\* cited by examiner

METHOD OF CONSTRUCTING A CIRCUITRY ASSEMBLY FOR HEAT DISPERSAL USING A PHASE CHANGE MATERIAL

TECHNOLOGICAL FIELD

The present invention is generally in the field of heat-sinking and cooling systems, and particularly relates to phase change material (PCM) based heatsinking.

BACKGROUND

High power electrical/electronic circuitries can generate substantial amounts of heat during operation, causing overheating that can damage the circuitries, or deteriorate their reliability, if proper cooling and/or heatsinking is not applied. For example, high power amplifiers (HPA) used for beaming microwave bursts e.g., as used in satellite communication and radar systems, can experience very high power activation bursts resulting in abrupt heating of the amplifying circuitries. Conventionally, fluid-cooled (e.g., by air or water) heatsinks (e.g., plate/fin/conduction path radiators) are thermally coupled to the packaging of the HPA circuitries to dissipate and distribute the heat thereby produced. However, electronic circuitries are becoming compactly smaller and more powerful, thus yielding highly concentrated heat sources formed by the high power circuitries, which aggravates the cooling problem, particularly under the growing demand for dense packaging, low weight, and operation in harsh environments.

The conventional fluid cooled heatsink solutions can be effective in applications wherein the produced heat is uniformly distributed across the top surface of the semiconductor die. However, as the electronic components are diminished in size, the conventional fluid cooled heatsink solutions are becoming less effective, since the significant amounts of the heat is produced in small discrete areas of the IC densely populated by the high-power circuitries, resulting in significantly high temperatures evolving in small discrete areas of the IC substrate. Since the high heat producing spots are discretely distributed over the area of the IC substrate, only small amounts of heat can be dispersed by the fins at the extremities (away from the heat source) of the heatsink, such that standard heatsinks cannot effectively cool the IC.

A possible attempt to overcome this problem suggests spreading the heat more efficiently through the base of the heatsink. For example, in some of the solutions used nowadays heat pipes (also known as vapor chambers) are embedded in the heatsink to improve heat dispersion from the condensed high-power circuitry areas to the extremities. Though heat pipe techniques can somewhat mitigate problems associated with distribution of heat in heatsink devices, they are not so effective when excess amounts of heat needs to be quickly removed from discrete locations on a surface of a high frequency IC (>1 GHz).

For example, temperature control is critical to the performance of radar systems, since the electrical performance of the HPAs decreases as their temperatures are increased. Hence, radar system are typically required to maintain the temperatures of the HPAs junctions below about 150° C., and guarantee that the temperature variations between the modules do not exceed approximately 10° C., to assure reliability. These requirements can be theoretically achieved by reducing the duty cycle, and/or the pulse width, of the radar system, and/or using powerful cooling equipment, which is inevitably costly in terms of weight, size, and monetary price, and usually not so reliable. In practice, radar systems nowadays require some combination/tradeoff of these temperature control schemes to guarantee continuous reliable operation.

Some heatsink/cooling techniques knows from the patent literature are briefly described hereinbelow:

U.S. Pat. No. 6,848,500 discloses an apparatus for reducing peak temperatures and thermal excursions, of semiconductor devices, particularly in pulsed power applications. The apparatus comprises thermally coupling phase change material (PCM) to the dissipating semiconductor device. PCM absorbs heat and stays at a constant temperature during its phase change from solid to liquid. The PCM melting point is chosen so that it is just below the temperature the device would otherwise achieve. When the device approaches the maximum temperature, the PCM melts, drawing heat from the device and lowering the device's peak temperature. As the device stops dissipating, after its pulse period, the PCM material solidifies releasing the heat it absorbed. The apparatus lowers the peak temperature by absorbing heat when the device is dissipating. The apparatus also keeps the semiconductor device from cooling off as much as it would cool without the apparatus, as the PCM material releases heat during the part of the cycle when it is re-solidifying, i.e., when the pulse power is off. By lowering the peak temperature the device achieves, and increasing the temperature of the device when it is in the off portion of its pulsed power cycle the temperature excursions of the device during operation are reduced. By reducing the temperature swings, that the device sees during operation, the thermal stress is reduced and the reliability of the device is improved.

US Patent Publication No. 2002/033247 describes a device comprising a phase change material arranged in or on a heat sink element in such a way that significant heat flow from a central processing unit (CPU) via a support only if the heat sink exceeds the phase change temperature of the phase change material, which thus ensures that the phase change material only absorbs the output peaks from the CPU.

International Patent Publication No. WO 2004/109798 describes a method for thermally protecting electronic units in an electronic device, particularly in a mobile radio device, with heat-generating electrical units (heat sources), particularly with electrical components and circuits. According to the invention, the heat-generating electrical units are brought into working contact with a substance system (heat sink), which has a phase-change temperature that is near a predetermined operating temperature of the electronic device.

GENERAL DESCRIPTION

The present application provides techniques and structures exploiting the properties of PCMs to absorb heat and maintain a substantially constant temperature during their phase change, for heatsinking heat producing regions of integrated circuits (ICs). The inventor hereof found out that high-power ICs can be effectively cooled using PCM to pump heat directly from the spots/regions of the substrate of the IC wherein heat producing circuitry junctions are densely embedded, and letting the heated PCM to migrate away from the substrate into a heatsink vessel (also referred to herein as PCM vessel) for condensation and dispersion of the heat thereby dissipated. This novel approach can thus surgically withdraw heat substantially directly from the hot spots/regions of the IC substrate, rather than from its external surface area (as commonly done nowadays), and thereby quickly and effectively distribute and disperse the excess heat produced at relatively small discrete spots/regions of the IC substrate over larger surface areas of the heatsink vessel, that can be then easily cooled using conventional cooling techniques (e.g., using plate/fin/conduction-path radiators and/or a streamed coolant).

In order to effectively sink heat from the heat producing spots/regions densely populated by high-power circuitries in an integrated circuit die, embodiments disclosed herein are designed to allow a fluidic PCM to migrate into the substrate of the IC and directly contact, or reside in close proximity to, regions of the substrate (e.g., Silicon, Gallium Arsenide, or suchlike) in which the active heat producing components are embedded. This is achieved in some embodiments by forming at least one lumen or channel in the substrate of the IC and fluidly coupling the lumen/channel to a heatsink vessel containing a PCM. The heatsink vessel is configured to enable the PCM to at least partially propagate into the lumen/channel formed in the substrate of the IC, to thereby absorb heat therefrom and undergo a phase change process, and receive back and condense the heated PCM thereinside.

Optionally, but in some embodiments preferably, the PCM is a fluidic PCM, such as but not limited to water, configured to propagate in a liquid state at least partially into the lumen/channel formed in the substrate of the IC and absorb heat therein, change into a gaseous state once reaching a determined threshold temperature, and migrate under gaseous pressure forces evolving inside the lumen/channel back into the heatsink vessel for condensation.

In order to effectively remove heat directly from discrete heat producing regions of the substrate of the IC, the at least one lumen/channel is formed in some embodiments along at least one heat producing region of the substrate containing heat producing circuitries/semiconductor junctions of the IC (e.g., accommodating active gates/transistors). The heatsinking can be maximized by forming the at least one lumen/channel in close proximity to, and in some embodiments directly underneath the, active semiconductor junctions of the substrate e.g., underneath die regions comprising high power transistors.

Optionally, but in some embodiments preferably, the heatsink vessel is at least partially filled with a porous medium (e.g., sintered metal, glass, or ceramic material) configured to contain the fluidic PCM in its liquid state, and cause capillary motion (capillary action) of the liquid PCM therethrough and into the at least one lumen/channel formed in the substrate of the IC. In some possible embodiments the at least one lumen/channel is also at least partially filled with a porous medium (e.g., sintered metal, glass, or ceramic material) configured to cause capillary motion of the liquid PCM therethrough.

Optionally, but in some embodiments preferably, the at least one lumen/channel and its coupling to the porous medium are configured to permit circulation of the fluidic PCM therebetween, as described hereinbelow.

At least some portion of the PCM introduced by capillary motion through the porous medium into the at least one lumen/channel formed in the substrate of the IC contacts, or resides in close proximity to, the heat producing regions of the IC substrate, and thus absorbs the heat produced by the IC circuitry during its operation, such that when a certain temperature of the substrate is reached, the PCM undergoes a phase change process and at least some portion of the PCM in the at least one lumen changes into a gaseous state, thereby absorbing more heat from the IC substrate while maintaining a substantially constant temperature level of the substrate i.e., the substrate temperature is maintained within a range about (slightly above or below) a predetermined threshold temperature level.

As more PCM is changed into a gaseous state, increased pressure conditions evolving in the at least one lumen/channel cause the gaseous PCM to propagate along the lumen/channel and migrate at peripheral regions thereof back to the porous medium contained inside the heatsink vessel, to condense back into liquid state thereinside, and draw new liquid PCM through the porous medium towards the at least one lumen/channel for absorbing more heat from the substrate of the IC. In this way the PCM is circulated in liquid state through the porous medium into the at least one lumen/channel, and in gaseous state through the at least one lumen/channel back into the heatsink vessel, thereby continuously removing heat form the substrate of the IC to the heatsink vessel, and therefrom to the external environment/atmosphere, and reducing the temperature of the substrate and its IC. Once the temperature of the substrate of the IC is reduced to a level below the phase change temperature threshold, the phase change process terminates, which also terminates the circulation of the PCM.

The heatsink vessel can be sealably attached to the substrate of the IC in fluid communication with the at least one lumen/channel formed in the substrate. For example, and without being limiting, one or more heatsink vessels, each containing a porous medium and a fluidic PCM, can be sealably attached at one or more respective sides of heat producing components of an IC, and/or underneath them. In some possible embodiments one or more cavities, each containing porous medium and fluidic PCM, are formed in the IC substrate in respective sides of heat producing components of an IC, and/or underneath them.

The heatsink techniques disclosed herein can thus provide a passive thermal ground used to surgically withdraw heat from discrete small regions of a substrate of a IC densely populated by heat producing junctions, and reduce their temperatures by about 20° C. to 40° C., optionally 25° C. to 35° C., and in certain embodiments by about 30° C., without requiring additional cooling equipment/elements (e.g., without externally applying cooled fluids). This heat reduction can be thus translated into an overall weight reduction of systems, by diminishing, or altogether abolishing, the active cooling systems that high-power systems are usually equipped with, and/or into improved reliability e.g., mean time between failures (MTBFs) can be increased by about 800%, and/or by increasing performance e.g., in terms of increased duty cycle, and/or pulse width, and/or transmission ranges.

One inventive aspect of the subject matter disclosed herein relates to a heatsink assembly comprising a substrate (e.g., made of a semiconducting material, such as, but not limited to, Gallium-Arsenide or Silicon) having an active circuitry. The substrate comprises at least one cavity located adjacent to at least one heat producing element of the active circuitry, at least one vessel sealably coupled to the substrate in fluid communication with the at least one cavity, and a phase change material (PCM) contained inside the vessel. The vessel and at least one cavity configured to facilitate migration of the PCM (e.g., by capillary action/motion) from said vessel into the at least one cavity for absorbing heat produced by the at least one heat producing element of the active circuitry. In some embodiments the at least one vessel and the at least one cavity are configured to circulate the PCM therebetween, to thereby transfer the heat absorbed by the PCM to the at least one vessel. Optionally, but in some embodiments preferably, the PCM comprises water.

The at least one vessel comprises in some embodiments a porous medium configured to facilitate migration of the PCM therethrough towards the at least one cavity in the substrate. Optionally, the at least one cavity comprises a porous medium configured to facilitate migration of the PCM inside the substrate towards the at least one heat producing element. The at least one of the at least one vessel and the porous medium can be configured to condense the heated PCM. In some embodiments the porous medium(s) define pore sizes in a range of 100 to 70,000 nanometer. The porous medium comprises in some embodiments a sintered material e.g., made of metal or ceramic materials, or a combination thereof.

The substrate is attached in some embodiments to a carrier board. The carrier board comprising at least one via configured to communicate between the at least one vessel and the at least one cavity and facilitate migration of the PCM therethrough from the at least one vessel into the at least one cavity. A plurality of substrates, each having a respective active circuitry and at least one cavity located adjacent to at least one heat producing element of said respective active circuitry, can be attached to the carrier board, and the carrier board can comprise a respective at least one via configured to communicate between the at least one vessel and the at least one cavity of a respective substrate of the plurality of substrates. In some embodiments a plurality of the at least one vessel are used, where each of the plurality of vessels contains PCM and being sealably coupled to at least one of the plurality of substrates in fluid communication with its at least one cavity through at least one of the vias of the carrier board. Optionally, and in some embodiments preferably, the assembly comprises a respective vessel for each one of the plurality of substrates.

The at least one via can be configured to facilitate capillary motion of the PCM therethrough. For example, a diameter of the at least one via in some embodiments is in a range of 10 to 100 micrometer.

Optionally, the carrier board comprises at least one cavity configured to receive the PCM from the at least one vessel and facilitate migration of the PCM therethrough to the at least one cavity of a substrate through the at least one via of the carrier board. The at least one cavity of the carrier board may comprise a porous medium configured to facilitate the PCM migration therethrough. The porous medium contained in the at least one cavity of the carrier board can be made from the same materials, and using the same techniques, as described hereinabove and hereinbelow, and also can define the same pore sizes.

In some embodiments the carrier board comprises at least one coating layer applied over a surface area thereof. The at least one via can be configured to pass through the at least one coating layer. The at least one coating layer can be electrically coupled to the active circuitry, and/or configured to disperse heat removed from the substrate by the PCM. The at least one vessel can be thus sealably attached over the at least one coating layer of the carrier board.

The at least one vessel comprises in some embodiments one or more materials having good thermal conductivity e.g., Copper, Gold, Aluminum, Silver, or a combination thereof. In some embodiment the at least one vessel comprises a material having thermal conductivity greater than 100 w/(m·K).

Optionally, the depth of the at least one cavity of the substrate is in a range of 55% to 85% of a thickness of said substrate. For example, a distance of an edge of the at least one cavity from the at least one heat producing element of the active circuitry is in some embodiments in a range of 20 to 50 micrometer. A width of the at least one cavity in the substrate ca be in a range of 5 to 70 micrometer.

Another inventive aspect of the subject matter disclosed herein relates to a method for dispersing heat produced by active circuitry embedded in, or on, a substrate. The method comprising forming at least one cavity in said substrate, placing PCM inside at least one vessel, and sealingly coupling between said at least one vessel and said at least one cavity. The method may comprise placing a porous medium inside the at least one vessel. The porous medium can be configured to hold at least some portion of the PCM and facilitate migration thereof towards the at least one cavity. Optionally, the method comprises placing a porous medium inside the at least one cavity.

The coupling comprises in some embodiments forming at least one via in a carrier board, sealingly attaching the substrate to the carrier board such that it's at least one cavity is in fluid communication with the at least one via, and sealingly attaching the at least one vessel to the carrier board such that the at least one via communicates between the at least one vessel and the at least one cavity. The method can comprise forming a plurality of vias in the carrier board, sealingly attaching a plurality of substrates to the carrier board, each of the plurality of substrates having a respective active circuitry and at least one cavity. The substrates can be attached to the carrier board such that the at least one cavity of a respective substrate of the plurality of substrates communicates with the at least one vessel through a respective at least one via of the carrier board.

The method comprises in some embodiments placing a PCM in a plurality of vessels, sealingly coupling each of the plurality of vessels to at least one of the plurality of substrates in fluid communication with its at least one cavity through at least one of the vias of the carrier board. Optionally, but in some embodiments preferably, the method comprises coupling a respective vessel to each one of the plurality of substrates.

In some possible embodiments at least one cavity is formed in the carrier board. The at least one cavity configured to receive the PCM from the at least one vessel and facilitate migration thereof to the at least one cavity of a substrate through the at least one via of the carrier board. The method can also comprise placing a porous medium in the at least one cavity of the carrier board.

Optionally, the method comprises applying at least one coating layer over a surface area of the carrier board, forming the at least one via to pass through said at least one layer, and thermally coupling between said at least one coating layer and the at least one vessel.

Yet another inventive aspect of the subject matter disclosed herein relates to a heatsink vessel comprising a PCM and a porous medium configured to hold at least a portion of the PCM and facilitate migration thereof therethrough. The heatsink vessel having at least one opening configured to sealingly attach to a substrate and facilitate migration of the PCM therethrough towards the substrate for absorbing heat from the substrate by the PCM. Optionally, the heatsink vessel comprises one or more thermally conducting materials. Thus, the heatsink vessel can be configured to absorb heat from the PCM by at least one of the porous medium and the vessel.

A heatsink assembly can thus comprise at least one heatsink vessel according to any of the embodiments disclosed herein, and a carrier board attachable to at least one substrate having an active circuitry. The carrier board comprises at least one via, and the at least one heatsink vessel sealingly coupled to the at least one via to facilitate migration of at least a portion of the PCM therethrough. Optionally, the carrier board comprises at least one cavity configured to facilitate migration of at least a portion of the PCM therethrough. The at least one cavity in the carrier board may contain a porous medium configured to facilitate migration of at least a portion of the PCM therethrough.

BRIEF DESCRIPTION OF THE DRAWINGS

In order to understand the invention and to see how it may be carried out in practice, embodiments will now be described, by way of non-limiting example only, with reference to the accompanying drawings. Features shown in the drawings are meant to be illustrative of only some embodiments of the invention, unless otherwise implicitly indicated. In the drawings like reference numerals are used to indicate corresponding parts, and in which:

FIG. 1B shows a possible embodiment wherein the cavity in the substrate is at least partially filled with a porous medium, and FIG. 1C demonstrate an operational state wherein the PCM is circulated between the cavity in the substrate and the PCM vessel;

DETAILED DESCRIPTION OF EMBODIMENTS

Figure 1A:
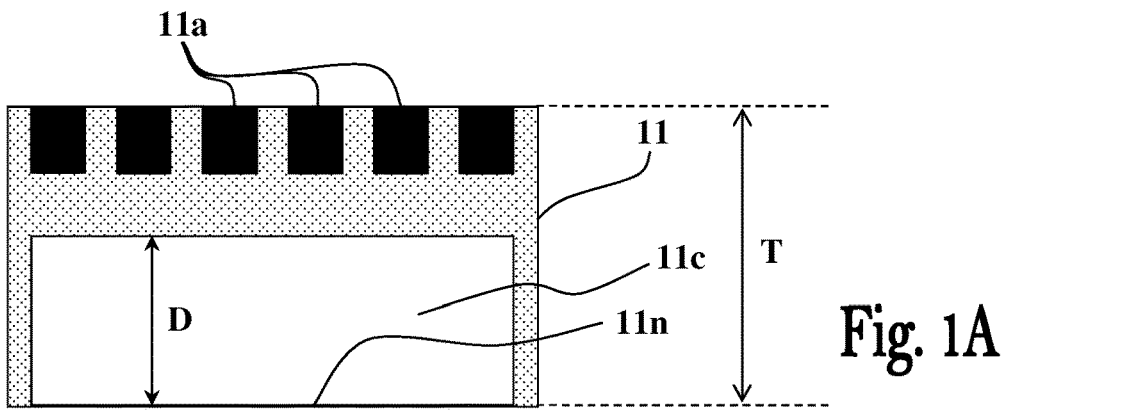
FIGS. 1A to 1C schematically illustrate a heatsinking technique according to some possible embodiments, wherein FIG. 1A demonstrates sealing a cavity/lumen formed in a substrate of an IC by a PCM vessel.

One or more specific embodiments of the present disclosure will be described below with reference to the drawings, which are to be considered in all aspects as illustrative only and not restrictive in any manner. In an effort to provide a concise description of these embodiments, not all features of an actual implementation are described in the specification. Elements illustrated in the drawings are not necessarily to scale, or in correct proportional relationships, which are not critical. Emphasis instead being placed upon clearly illustrating the principles of the invention such that persons skilled in the art will be able to make and use them, once they understand the principles of the subject matter disclosed herein. This invention may be provided in other specific forms and embodiments without departing from the essential characteristics described herein.

An object of the embodiments disclosed herein is to sink heat produced in a die by active electrical components, such as HPAs. For this purpose channels/lumens are formed in a substrate (e.g., semiconductor) carrying/embedding the circuitry. The channels/lumens can be formed in the substrate under heat producing areas/junctions. A porous medium containing a flowable phase change material (PCM e.g., water) is then coupled to the substrate in fluid communication with the channels/lumens. The PCM and porous medium are configured to introduce at least some portion of the PCM, in liquid state, into the channels/lumens formed in the substrate by capillary motion. During activation peaks of the electrical components the PCM absorbs the produced heat and changes into a gaseous phase that is flown back into the porous medium due to increase of pressure in the channels/lumens. The gaseous PCM is condensed in the porous medium and circulated back into the channels/lumens to sink more heat from the circuitries.

The porous medium and the PCM can be housed in a heatsink vessel sealably attached to the substrate. Optionally, but in some embodiment preferably, the heatsink vessel with the porous material and PCM contained thereinside is attached to an intermediate layer (e.g., semiconductor layer, printed circuit board made of ceramic or organic material, or suchlike) to which the substrate of the IC is attached. The intermediate layer comprises in some embodiments one or more vias (capillary pass-through holes) formed therein for communicating between the heatsink vessel and the at least one lumen formed in the substrate, for passage of the fluid PCM therethrough.

FIG. 1A exemplifies construction of a heatsink assembly 10 configured to remove heat from a substrate 11 (e.g., made from a semiconductor material, such as Silicon or Gallium-Arsenide) of an IC. In some embodiments at least one open channel 11c (also referred to herein as cavity or lumen) is formed in a bottom side of the substrate 11. Optionally, but in some embodiments preferably, the at least one open channel 11c is formed underneath a region of the substrate 11 comprising a plurality of active gates/junctions 11a (also referred to herein as heat producing element e.g., amplifier/transistor) of the IC. The at least one open channel 11c can have a substantial depth D, in order for it to reach close proximity to the active gates/junctions 11a of the IC. For example, in some possible embodiments the depth D of the channel 11c is in a range 60% to 80% of the thickness T of the substrate 11, optionally about 70% of the thickness T of the substrate 11 e.g., depth D of 70 micrometer in a substrate having thickness T of 100 micrometer.

The width of the channel 11c is configured in some embodiments to facilitate capillary motion of the PCM 14 towards the active gates/junctions 11a. Thus, the width of the channel 11c can be about 5 to 75 micrometer. In some embodiments a plurality of elongated and substantially parallel channels 11c are formed in the substrate 11 e.g., as exemplified in FIG. 3.

The at least one open channel 11c is sealingly closed by attaching a cup-shaped heatsink vessel 13 over its bottom side opening 11n. The heatsink vessel 13 is configured to hold a liquid PCM 14 thereinside, and to cause migration of at least some portion of the PCM 14 towards and into the at least one open channel 11c. The heatsink vessel 13 can be fabricated from materials having good/high thermal conductivity, such as, but not limited to Copper, Carbal, aluminum, Silicon, Aluminum Nitride, and suchlike. The heatsink vessel 13 can be configured to hold PCM volume of about 1 to 10 $cm^3$.

Optionally, but in some embodiments preferably, the heatsink vessel 13 comprises a porous medium 13p configured to hold the PCM 14 in its pores and cause capillary motion thereof through the pores, towards and through the bottom opening 11n of the at least one open channel 11c. The pores of the porous medium 13p can be configured to permit capillary action of the PCM in its liquid state therethrough. For example, in the embodiments utilizing water as PCM the pores of the porous media 13p can be generally in a range of about 5 to 100 micrometers. In some possible embodiments the porous medium 13p is made of sintered metal, glass, silicon, or ceramic material. After placing the porous medium 13p inside the heatsink vessel 13 and introducing the PCM 14 thereinto, the heatsink vessel 13 is sealably attached (e.g., using thermally conducting adhesive, such as, but not limited to, epoxy glue, solder, brazing, to the substrate 11 such that its opening 13*n* communicates with the opening(s) 11*n* of the at least one open channel 11*c*.

Figure 1B:
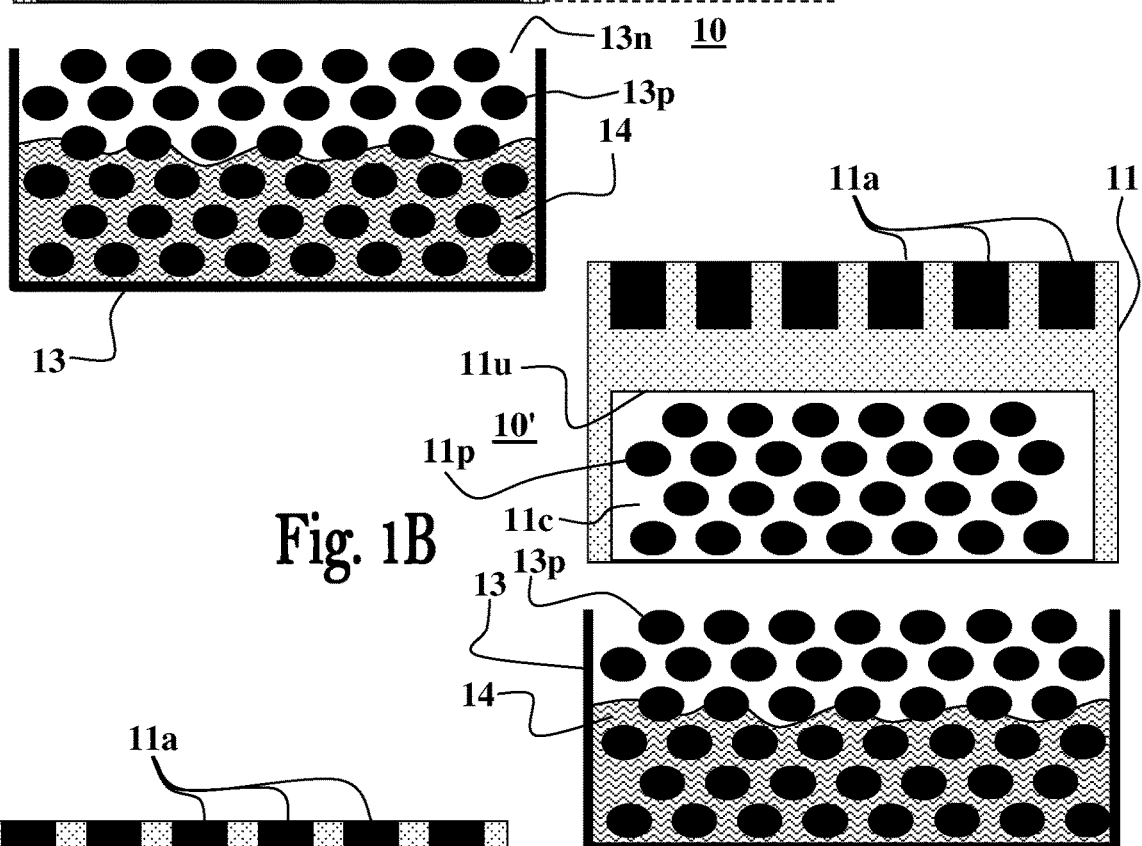

FIG. 1B exemplifies a heatsink assembly 10' according to some possible embodiments, wherein the at least one open channel 11*c* formed in the substrate 11 of the IC is filled with a porous medium 11*p*. As seen, the heatsink assembly 10' is principally similar in structure and operation to the heatsink assembly 10 of FIG. 1A. The porous medium 11*p* of the at least one open channel 11*c* can be configured to facilitate capillary action of the PCM 14, and thereby cause further migration of the PCM 14 towards the active gates/junctions 11*a* of the IC. In some embodiments the pore size of the porous medium 11*p* is in same range as of pore sizes of the porous medium 13*p*, and it can be also prepared using same or similar materials. In this embodiment upon sealably attaching the heatsink vessel 13 to the substrate 11, porous medium continuity is obtained by the porous mediums 13*p* and 11*p*, extending from the interior of the heatsink vessel 13 into the at least one open channel 11*c*. Accordingly, in this embodiment the PCM 14 can capillary migrate all the way from the heatsink vessel 13 to the upper face 11*u* of the at least one open channel 11*c* through the porous mediums 13*p* and 11*p*, and directly absorb therefrom the heat generated by the active gates/junctions 11*a*.

Figure 1C:
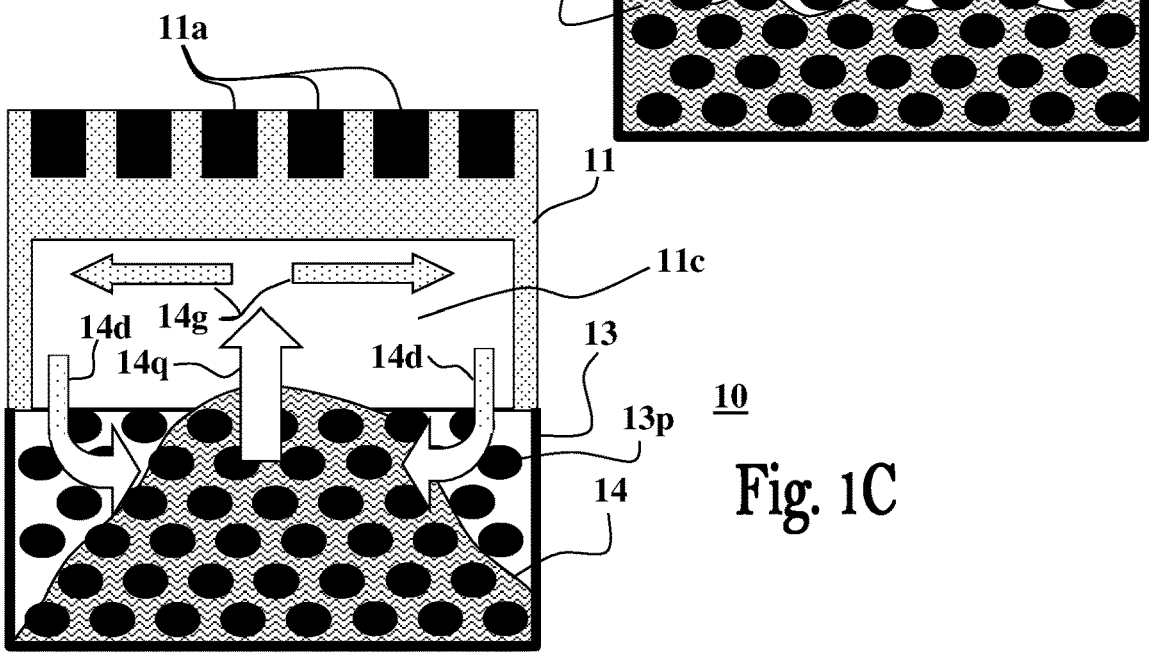

FIG. 1C shows the heatsink assembly 10 after attaching the heatsink vessel 13 to the substrate 11 of the IC. Circulation of the PCM 14 according to some possible embodiments is demonstrated by the arrows 14*q*, 14*g* and 14*d*. Particularly, some portion of the liquid PCM 14 capillary migrates (14*q*) into the at least one channel 11*c* and absorbs the heat produced by the active gates/junctions 11*a*. The PCM 14 heated in the at least one channel 11*c* change into gaseous state (14*g*) and spread thereinside and absorb more heat from the substrate 11, without changing its temperature to thereby maintain the temperature of the substrate 11 substantially within the phase changing temperature range of the PCM 14. As the pressure inside the channel 11*c* increase due to the heated gaseous PCM (14*g*), portions of the gaseous PCM (14*d*) propagate back into the heatsink vessel 13 at the boundaries of the at least one open channel 11*c*. The heat of the gaseous PCM (14*d*) introduced into the heatsink vessel 13 is transferred to the porous medium 13*p* and the walls of the heatsink vessel 13, and thereby cooled and condense back into a liquid state PCM capillary propagating (14*q*) into the at least one channel 11*c* to absorb more heat from the active gates/junctions 11*a* of the substrate 11.

Figure 2A:
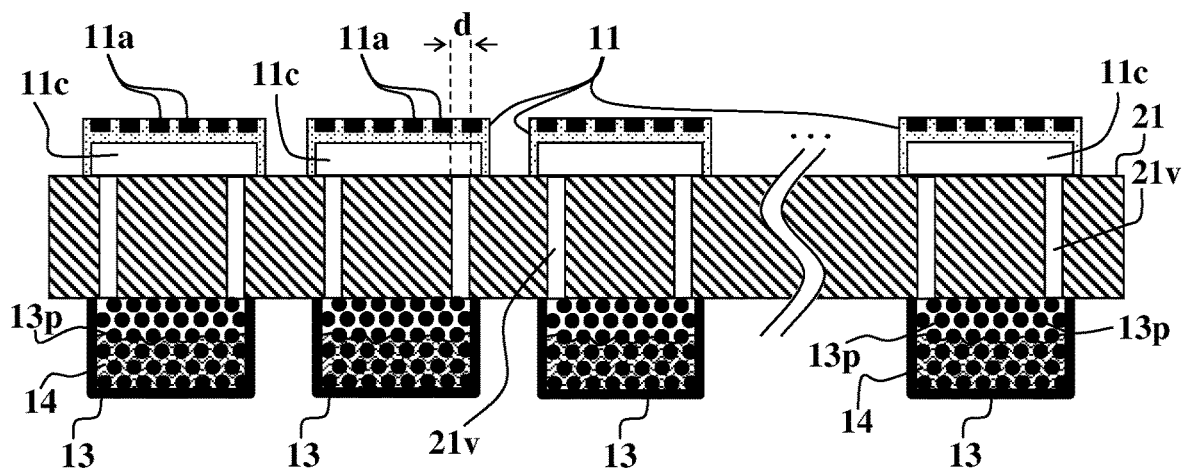
FIG. 2A and FIG. 2B schematically illustrate structures for heatsinking a plurality of ICs according to some possible embodiments.

FIG. 2A schematically illustrate a heatsink assembly 20 configured for heatsinking substrates 11 of a plurality of ICs mounted onto a board 21 (also referred to herein as IC board e.g., a printed circuit board—PCB, a Silicon substrate, an organic substrate, or suchlike. In this specific and non-limiting example, each IC substrate 11 is coupled to a respective heatsink vessel 13, comprising a PCM 14, through respective one or more vias 21*v* (capillary pass-through bores). The vias 21*v* are configured to facilitate capillary action for the liquid PCM 14 to migrate therethrough from each heatsink vessel 13 into at least one channel 11*c* of a respective IC substrate 11 to absorb heat therefrom. Optionally, but in some embodiments preferably, the heatsink vessels 13 also comprise porous media 13*p* configured to facilitate the capillary migration of the liquid PCM 14 to the respective channels 11*c*. In possible embodiments one or more of the heatsink vessels 13 can be configured to couple to two or more of the IC substrates 11.

Figure 2B:
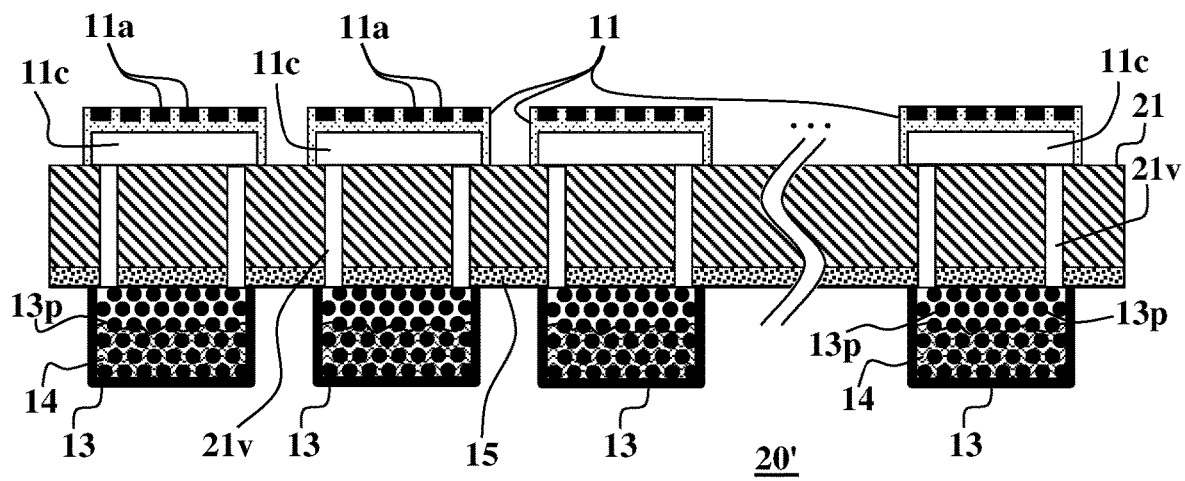

FIG. 2B shows a heatsink assembly 20' which is principally similar in structure and operation to the heatsink assembly 20 of FIG. 2A, but it is different in that the board 21 in this embodiment comprises one or more coating layers 15 applied on a bottom side thereof. As seen, in this embodiment the vias 21*v* formed in the board 21 also pass through the one or more coating layers 15 to form a continuous passage for the PCM 14 to capillary migrate from the heatsink vessels 13 to the at least one channel 11*c* of the respective substrates 11. In possible embodiments the one or more coating layers 15 comprise an electrically conducting material (e.g., Copper) electrically coupled to at least one of the ICs of the active gates/junctions 11*a*.

FIG. 2B depicts an embodiment wherein a single electrically conducting coating layer 15 covers a surface area of the bottom side of the board 21, and the heatsink vessels 13 are sealably attached to the electrically conducting coating layer 15 over respective vias 21*v*, to communicate with the channels 11*c* of the substrates 11 therethrough. In some embodiments wherein the one or more coating layers 15 comprise materials having good thermal conductivity, such as metals, the heatsinking is further improved as the heat absorbed from the PCM 14 by the walls of the heatsink vessels 13 also disperse in the one or more coating layers 15 covering the surface area of the bottom side of the board 21. Due to the larger surface area of the one or more coating layers 15, the heat absorbed therein can be quickly transferred to the external environment/atmosphere.

In some embodiments the diameter d of the vias 21*v* is about 10 to 100 micrometer.

Figure 3:
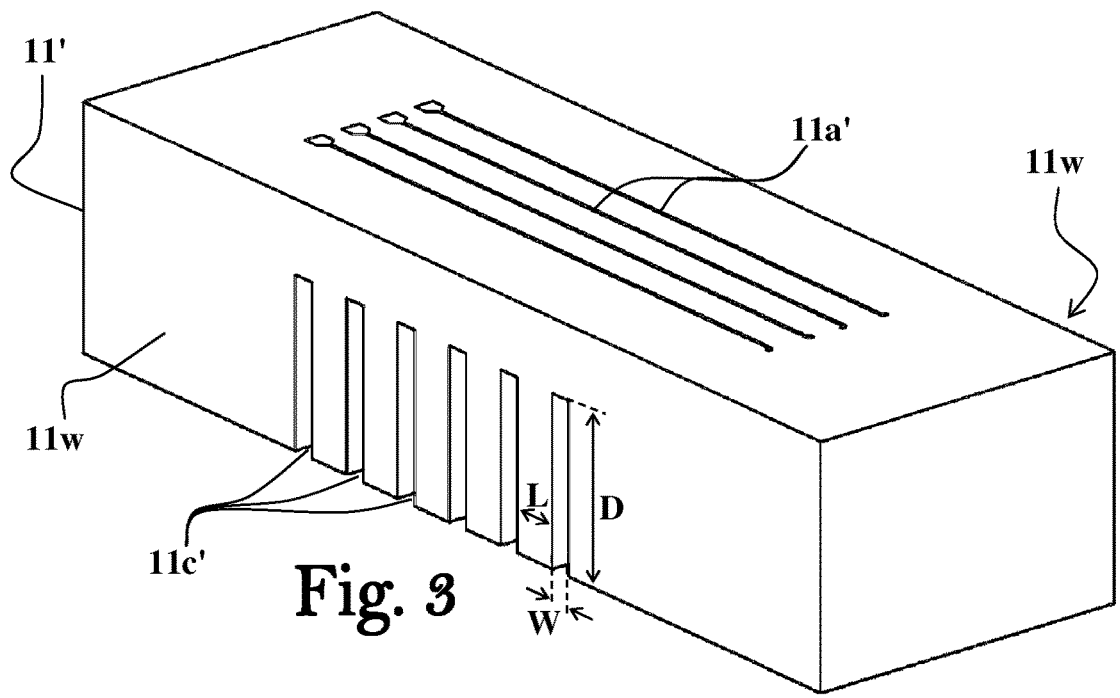
FIG. 3 schematically illustrates a multichannel structure formed in some embodiments in a substrate for heatsinking multiple circuitries of an IC.

FIG. 3 schematically illustrates a multichannel structure formed in some embodiments in a substrate 11' for heatsinking active gates/junctions 11*a*' of multiple ICs. In this non-limiting example a plurality of open channels 11*c*' are formed in the substrate 11' underneath active gates/junctions 11*a*' to allow the PCM to migrate to multiple regions in proximity to the active gates/junctions 11*a*' and dissipate the heat they produce during operation. Heatsink vessels (not shown) can be accordingly configured to enclose and seal the side openings of the open channels 11*c*'. Though the open channels 11*c*' are shown passing from side to side in the substrate 11', in some embodiments they are confined within the side walls 11*w*, such that they can be sealably closed by cup-shaped heatsink vessel (13), as exemplified hereinabove.

In this specific and non-limiting example the IC of the substrate 11' comprises four elongated and substantially parallel active gates/junctions 11*a*' regions, and the open channels 11*c*' pass in the substrate 11' in a traversing direction substantially perpendicular to the directions of the four active gates/junctions 11*a*' regions. Though the substrate 11' is shown comprising six traversing open channels 11*c*', it can be configured to comprise any other suitable number traversing open channels 11*c*', which can be determined according to the lengths of the active gates/junctions 11*a*' regions and the widths W of the traversing open channels 11*c*'. In some embodiments the width W of the traversing open channels 11*c*' is about 5 to 70 micrometer, and the distance L between two adjacent open channels 11*c*' is about 40 to 100 micrometer.

Figure 4A:
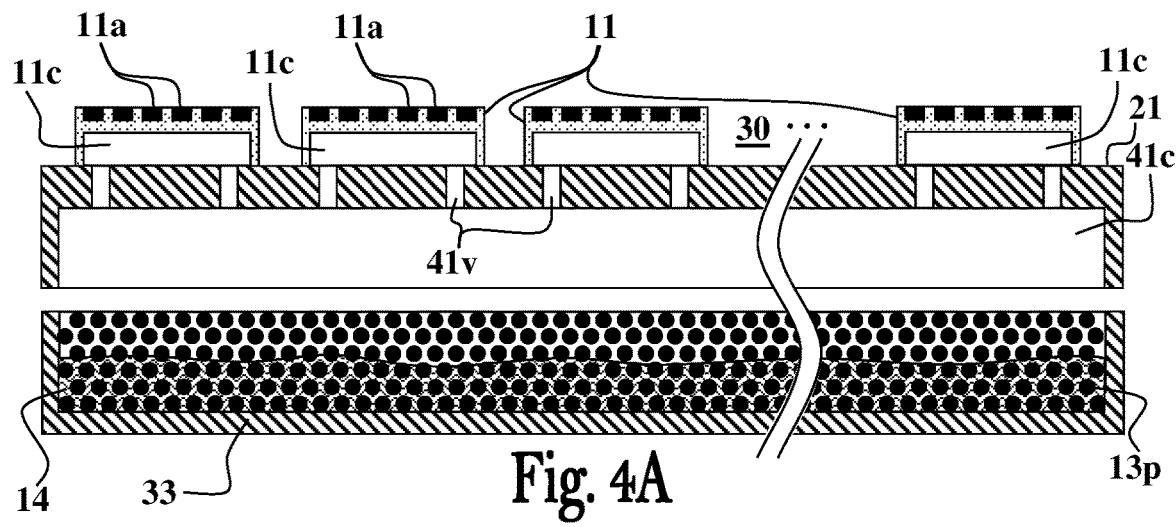
FIGS. 4A to 4C schematically illustrate structures for heatsinking a plurality of ICs according to some other possible embodiments.

FIG. 4A schematically illustrates a heatsink assembly 30 configured to dissipate and remove heat from active gates/junctions 11*a* of a plurality of ICs. In this specific and non-limiting example at least one elongated open channel 41*c* is formed along a substantial length of board 21, under a plurality of substrates 11 in which active gates/junctions 11*a* of a plurality of ICs are embedded. The heatsink assembly 30 comprises in some embodiments a plurality of parallel elongated open channels 41c, such as exemplified in FIG. 3 (designated by reference numeral 11c'). Each substrate 11 comprises a channel/cavity 11c, and each channel/cavity 11c is in fluid communication with the at least one elongated open channel 41c through at least one (capillary) via 41v. The heatsink assembly 30 comprises a corresponding heatsink vessel 33 comprising PCM 14 and configured to sealably close the at least one elongated open channel 41c.

The at least one elongated open channel 41c and the at least one via 41v are configured to facilitate capillary motion of the PCM 14 therethrough from the heatsink vessel 33 to the channels/cavities 11c of the substrates 11. Accordingly widths of the at least one elongated open channel 41c can be in the range (W) indicated hereinabove with reference to FIG. 3, and the diameters of the vias 41v can be in range (d) indicated hereinabove with reference to FIGS. 2A and 2B. Optionally, but in some embodiments preferably, the heatsink vessel 33 comprises a porous medium 13p filling a substantial portion, or all, of its volume. The porous medium 13p configured to hold the PCM 14 and facilitate capillary motion thereof into the at least one elongated open channel 41c.

Figure 4B:
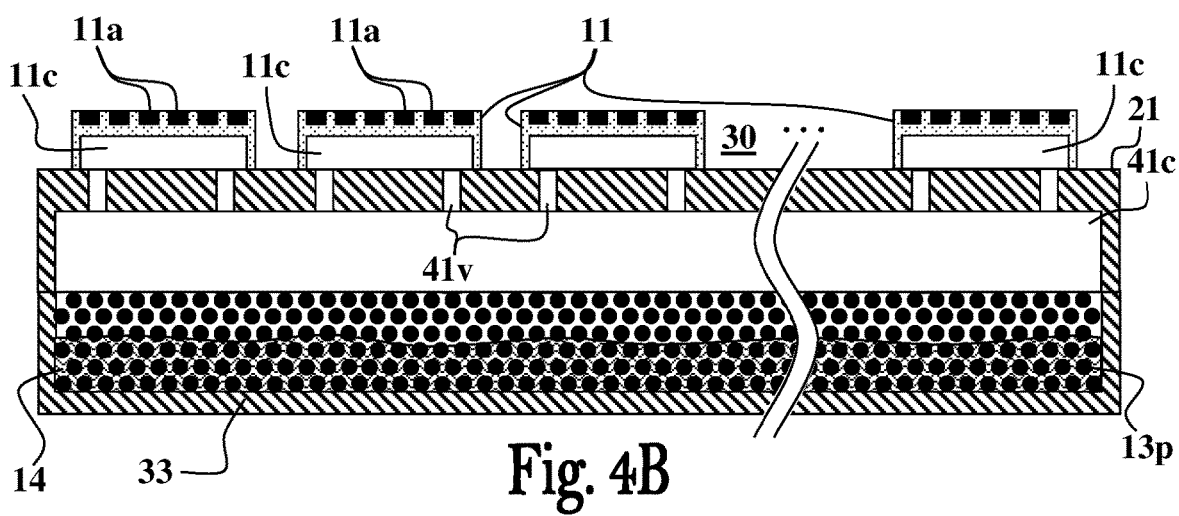

FIG. 4B shows the heatsink assembly 30 after sealably attaching the heatsink vessel 33 to the board 21. In this state the PCM 14 can capillary migrate from the heatsink vessel 33 into the channels/cavities 11c of the substrates 11 and absorb the heat produced by the active gates/junctions 11a, as described hereinabove in detail.

Figure 4C:
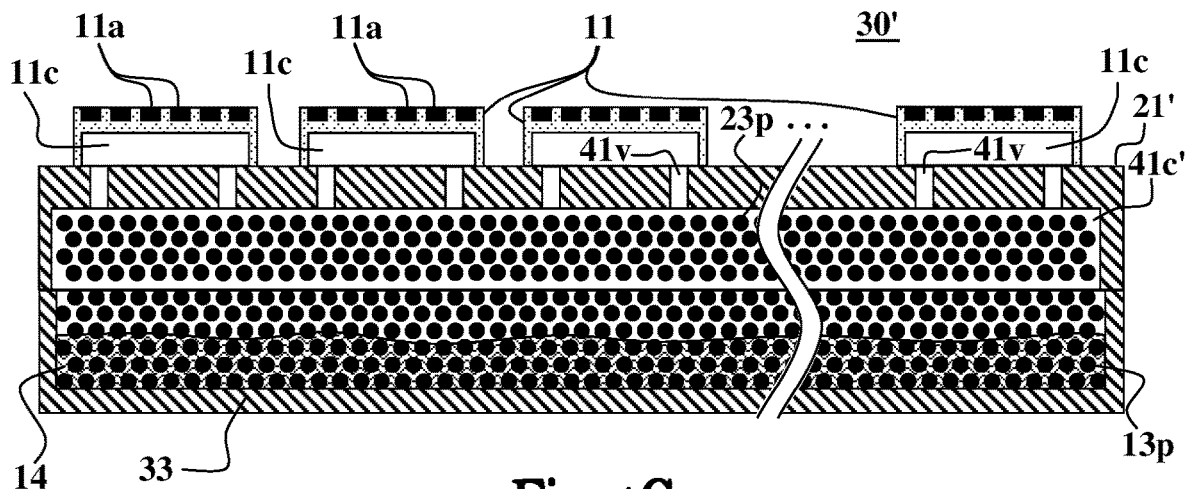

FIG. 4C shows another possible embodiment of a heatsink assembly 30' comprising at least one open channel 41c' filled with porous medium 23p. The heatsink assembly 30' is principally similar to the heatsink assembly 30 of FIGS. 4A and 4B, but provides continuous porous medium between the heatsink vessel 33 and the at least one open channel 41c', formed by the porous mediums 13p and 23p, for facilitating capillary migration of the PCM 14 therethrough from the heatsink vessel 33 to the vias 41v communicating the PCM 14 to the channels/cavities 11c. There is thus no need in this embodiment to adjust the width of the at least one open channel 41c' for capillary motion of the PCM 14, because it is filled with the porous medium 23p configured to guarantee capillary migration of the PCM 14 therethrough. The porous mediums 13p and 23p can be prepared from the same materials, and with the same geometrical properties, as described hereinabove with reference to FIGS. 1A to 1C and FIGS. 2A and 2B.

Optionally, the channels/cavities 11c formed in the substrates 11 of the ICs shown in FIGS. 2A and 2B and FIGS. 4A to 4C, are also filled with a porous medium (as exemplified din FIG. 1B). In some embodiments the board 21 comprises one or more layers (not shown in FIGS. 4A to 4C) electrically coupled to the ICs e.g., such as coating layer(s) 15 shown in FIG. 2B.

Figure 5:
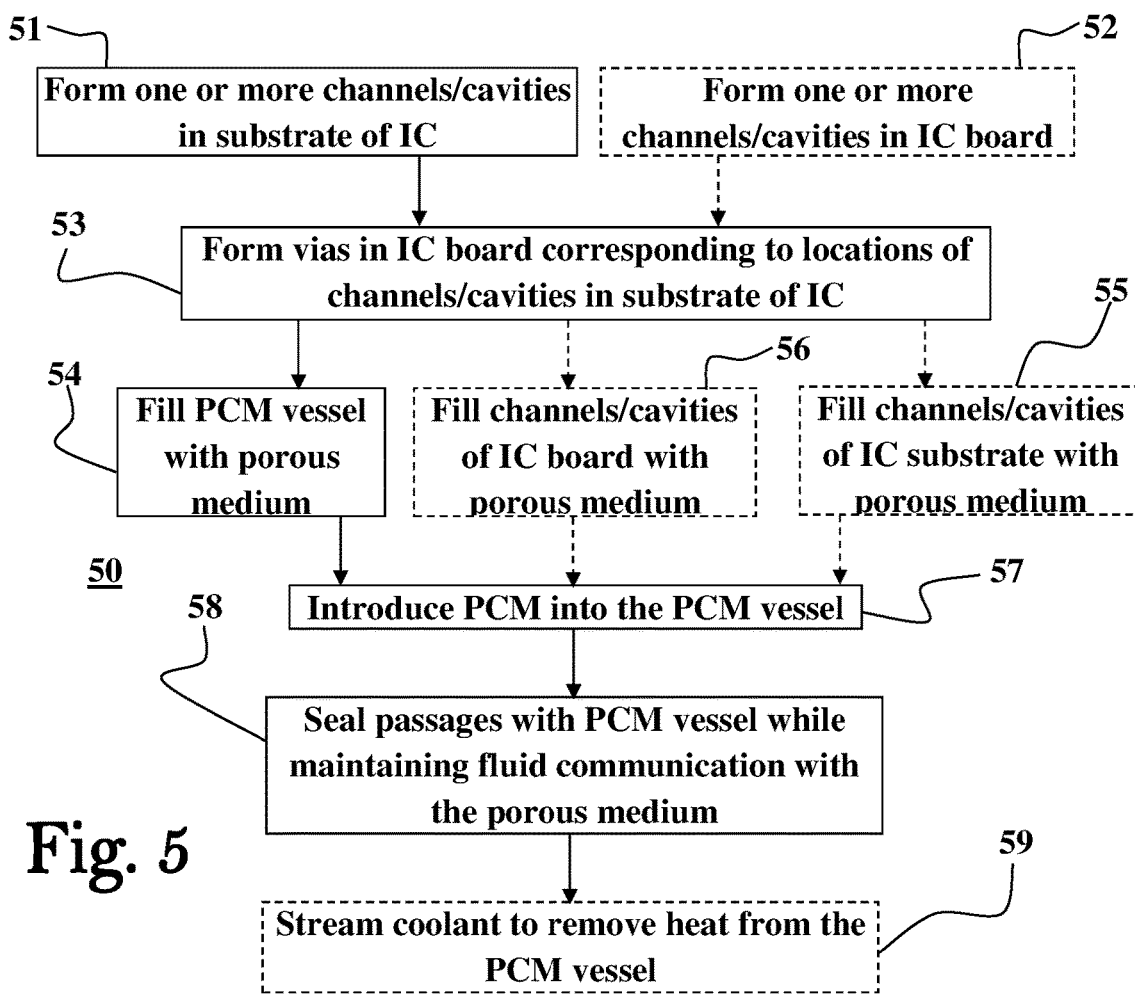
FIG. 5 is a flowchart schematically a heatsinking process according to some possible embodiments.

FIG. 5 shows a flowchart illustrating a heatsinking process 50 according to some possible embodiments. The process 50 starts in step 51, in which one or more channels/cavities (11c) are formed in substrates' (11) of one or more ICs, and optional step 52 in which one or more channels/cavities (41c/41c') are formed in the IC board (21/21'). The one or more channels/cavities (11c) are preferably formed in the substrates (11) as close as possible to the active gates/junctions (11a) of the ICs, as exemplified hereinabove.

Next, in step 53, one or more vias (21v/41v) are formed in the IC board (21/21') at locations corresponding to the locations of the one or more channels/cavities (11c) formed in substrates (11). In step 54 one or more PCM vessels (13/33) are filled with porous medium (13p), and in optional step 55 the one or more channels/cavities (11c) formed in the substrates (11) are filled with porous medium (11p). If one or more channels/cavities (41c/41c') are formed in optional step 52 in the IC board (21/21'), in step 56 they are optionally filled with a porous medium (23p), if so needed.

In step 57 PCM (14) is introduced into the one or more PCM vessels (13/33), and in step 58 the fluid passages i.e., the vias (21v/41v) formed in the IC board (21/21') and the optional channels/cavities (41c/41c') (if) formed in the IC board (21/21'), are sealably closed by the one or more PCM vessels (13/33). In optional step 59 a coolant is streamed over the PCM vessels (13/33) to remove heat absorbed therein from the PCM (14) circulated during the operation of the ICs.

Terms such as top/upper, bottom/lower, front, back, right, left, sides, and similar adjectives in relation to orientation of the elements and components of the assemblies shown in the figures refer to the manner in which the illustrations are positioned on the paper, not as any limitation to the orientations in which the apparatus can be used in actual applications.

It should also be understood that throughout this disclosure, where a process or method is shown or described, the steps of the method may be performed in any order or simultaneously, unless it is clear from the context that one step depends on another being performed first.

The heatsink techniques of the present application can be exploited, inter alia, for overall system weight and/or size reduction(s), increase of system performance and reliability, and reduce in monetary costs, thereby providing less demanding high-power systems that can be mounted in new and less resourceful platforms. It is appreciated that certain features of the subject matter disclosed herein, which are, for clarity, described in the context of separate embodiments, may also be provided in combination in a single embodiment. Conversely, various features of the disclosed subject matter, which are, for brevity, described in the context of a single embodiment, may also be provided separately or in any suitable sub-combination.

As described hereinabove and shown in the associated figures, the present invention provides heatsink assemblies configured to dissipate and distribute heat from electric/electronic circuitries, and related methods. While particular embodiments of the disclosed subject matter have been described, it will be understood, however, that the invention is not limited thereto, since modifications may be made by those skilled in the art, particularly in light of the foregoing teachings. As will be appreciated by the skilled person, the invention can be carried out in a great variety of ways, employing more than one technique from those described above, all without exceeding the scope of the claims.

For an overview of several exemplary features, process stages, and principles of the disclosed subject matter, the assemblies illustrated schematic ally and diagrammatically in the figures are intended for heatsinking electric/electronic circuitries. These heatsink assemblies are provided as exemplary implementations that demonstrates a number of features, processes, and principles used for removing heat from circuitries implemented in a substrate, but they are also useful for other applications and can be made in different variations. Therefore, the above description refers to the shown examples, but with the understanding that the invention recited in the claims below can also be implemented in myriad other ways, once the principles are understood from the descriptions, explanations, and drawings herein. All such variations, as well as any other modifications apparent to one of ordinary skill in the art and useful for heatsinking applications may be suitably employed, and are intended to fall within the scope of this disclosure.

The invention claimed is:

1. A method of constructing a circuitry assembly configured to disperse heat produced by active components embedded in or on a substrate, the method comprising:
    forming at least one cavity in said substrate;
    placing a phase change material (PCM) inside at least one vessel; and
    sealingly coupling between an opening of said at least one vessel and an opening of said at least one cavity, wherein the sealingly coupling comprises:
        forming at least one via in a carrier board;
        sealingly attaching the substrate to said carrier board such that the opening of the at least one cavity thereof is in fluid communication with said at least one via; and
        sealingly attaching the at least one vessel to said carrier board such that said at least one via communicates between the opening of the at least one vessel and the at least one cavity of the substrate.

2. The method of claim 1, further comprising at least one of the following:
    placing a porous medium inside the at least one vessel; or
    placing a porous medium inside the at least one cavity of the substrate.

3. The method of claim 1, further comprising at least one of the following:
    placing a porous medium inside the at least one vessel; or
    placing a porous medium inside the at least one cavity of the substrate.

4. The method of claim 1, further comprising:
    applying at least one coating layer over a surface area of the carrier board;
    forming the at least one via in the carrier board to pass through said at least one coating layer; and
    thermally coupling between said at least one coating layer and the at least one vessel.

5. The method of claim 1, further comprising at least one of the following: placing a porous medium inside the at least one vessel; and placing a porous medium inside the at least one cavity of the substrate.

6. The method of claim 1, further comprising forming at least one cavity in the carrier board configured to receive PCM from the at least one vessel and facilitate migration thereof to the at least one cavity of the substrate through the at least one via of the carrier board.

7. The method of claim 6, further comprising at least one of the following: placing a porous medium inside the at least one vessel; placing a porous medium inside the at least one cavity of the substrate; or placing a porous medium in the at least one cavity of the carrier board.

8. The method of claim 1, further comprising:
    forming a plurality of vias in the carrier board; and
    sealingly attaching a plurality of said substrate to said carrier board, each of said plurality of substrates having a respective active circuitry and at least one cavity, said plurality of substrates attached to the carrier board such that the opening of the at least one cavity of a respective substrate of said plurality of substrates communicates with the opening of the at least one vessel through a respective at least one via of the carrier board.

9. The method of claim 8, further comprising at least one of the following: placing a porous medium inside the at least one vessel; or placing a porous medium inside the at least one cavity of each one of the plurality of substrates.

10. The method of claim 8, further comprising:
    applying at least one coating layer over a surface area of the carrier board;
    forming the plurality of vias in the carrier board to pass through said at least one coating layer; and
    thermally coupling between said at least one coating layer and the at least one vessel.

11. The method of claim 10, further comprising at least one of the following: placing a porous medium inside the at least one vessel; or placing a porous medium inside the at least one cavity of each one of the plurality of substrates.

12. The method of claim 8, further comprising forming at least one cavity in the carrier board configured to receive PCM from the at least one vessel and facilitate migration thereof to the at least one cavity of each one of the plurality of substrates through the plurality of vias of the carrier board.

13. The method of claim 12, further comprising at least one of the following: placing a porous medium inside the at least one vessel; placing a porous medium inside the at least one cavity of each one of the plurality of substrates; or placing a porous medium inside the at least one cavity of the carrier board.

14. The method of claim 8, further comprising:
    placing a PCM in a plurality of vessels; and
    sealingly coupling each of said plurality of vessels to at least one of the plurality of substrates in fluid communication with its at least one cavity through at least one of the plurality of vias of the carrier board.

15. The method of claim 14, further comprising at least one of the following: placing a porous medium inside the plurality of vessels; or placing a porous medium inside the at least one cavity of each one of the plurality of substrates.

16. The method of claim 14, further comprising:
    applying at least one coating layer over a surface area of the carrier board;
    forming the plurality of vias in the carrier board to pass through said at least one coating layer; and
    thermally coupling between said at least one coating layer and the plurality of vessels.

17. The method of claim 16, further comprising at least one of following: placing a porous medium inside the plurality of vessels; or placing a porous medium inside the at least one cavity of each one of the plurality of substrates.

* * * * *